United States Patent [19]
Herd et al.

[11] Patent Number: 5,410,286
[45] Date of Patent: Apr. 25, 1995

[54] QUENCH-PROTECTED, REFRIGERATED SUPERCONDUCTING MAGNET

[75] Inventors: Kenneth G. Herd, Niskayuna; Evangelos T. Laskaris, Schenectady, both of N.Y.

[73] Assignee: General Electric Company, Schenectady, N.Y.

[21] Appl. No.: 201,964

[22] Filed: Feb. 25, 1994

[51] Int. Cl.$^6$ .......................... H01F 1/00; F25B 19/00
[52] U.S. Cl. .................................... 335/216; 62/51.1
[58] Field of Search ............... 335/216; 62/51.1, 51.2, 62/51.3; 324/318, 319, 248

[56] References Cited

U.S. PATENT DOCUMENTS

| | | | |
|---|---|---|---|
| 3,428,926 | 2/1969 | Bogner et al. | 335/216 |
| 3,491,547 | 1/1970 | Watkins | 62/217 |
| 3,823,575 | 7/1974 | Parel | 62/514 |
| 4,080,802 | 3/1978 | Annable | 62/514 JT |
| 4,689,970 | 9/1987 | Ohguma | 62/514 R |
| 4,782,671 | 11/1988 | Breneman | 62/514 R |
| 4,791,241 | 12/1988 | Ando et al. | 174/125.1 |
| 5,287,914 | 2/1994 | Hughes | 165/80.1 |
| 5,293,752 | 3/1994 | Nagao | 62/51.1 |

FOREIGN PATENT DOCUMENTS

| | | | |
|---|---|---|---|
| 2130375 | 5/1990 | Japan | 62/51.1 |
| 4161770 | 6/1992 | Japan | 62/51.2 |
| 4306472 | 10/1992 | Japan | 62/51.3 |
| 5001857 | 1/1993 | Japan | 62/51.3 |
| 2126694 | 3/1984 | United Kingdom | 62/51.1 |
| 2149901 | 6/1985 | United Kingdom | 62/51.1 |
| 2247942 | 3/1992 | United Kingdom | 62/51.1 |

*Primary Examiner*—Leo P. Picard
*Assistant Examiner*—Stephen T. Ryan
*Attorney, Agent, or Firm*—Douglas E. Erickson; Paul R. Webb, II

[57] ABSTRACT

A superconducting magnet including a superconducting coil assembly having a magnet cartridge, a cryocooler coldhead having a cold stage in thermal contact with the magnet cartridge, and a thermal buffer assembly. The thermal buffer assembly includes an inlet tube and an outlet tube each having an end connected to a helium pressure container which is placed in thermal contact with the magnet cartridge. A first gas pressure regulator on the inlet tube supplies helium gas and a second gas pressure regulator on the outlet tube vents helium gas so as to maintain a generally constant pressure for the helium gas within the helium pressure container. The high specific heat per unit volume of the pressurized gaseous helium acts as a thermal buffer to extend the time the magnet can operate superconductively without the cryocooler before quenching, such as during an electric power outage.

12 Claims, 3 Drawing Sheets

QUENCH-PROTECTED, REFRIGERATED SUPERCONDUCTING MAGNET

BACKGROUND OF THE INVENTION

The present invention relates generally to a superconducting magnet which is cooled by a cryocooler, and more particularly to such a magnet which maintains its superconductivity (i.e., it does not quench) for an extended period of time during cryocooler failure.

Superconducting magnets may be used for various purposes, such as to generate a uniform magnetic field as part of a magnetic resonance imaging (MRI) diagnostic system. MRI systems employing closed or open superconductive magnets are used in various fields such as medical diagnostics. Open magnets typically employ two spaced-apart toroidal-shaped superconducting coil assemblies, while closed magnets typically employ a single solenoidal-shaped superconducting coil assembly. The superconducting coil assembly includes the magnet cartridge which contains the superconducting wire.

Some superconducting magnets are cooled by a cryocooler coldhead (such as that of a conventional Gifford-McMahon cryocooler). If there is an electric power outage or if the cryocooler otherwise malfunctions (or even has its performance degrade over time), the superconducting magnet will heat up and quench (i.e., lose its superconductivity). Prior-art magnets include those with sensor systems which monitor cryocooler temperature and which send an alarm signal when there is a cryocooler failure from whatever cause (including an electric power failure). The thermal hold time of a superconducting magnet is the period of time from cryocooler failure to quench and is generally limited by the thermal mass of the magnet. The thermal hold time of prior-art, cryocooler-cooled, superconducting magnets is not long enough to wait out a lengthy power failure of several hours without quenching. If a substantial solid thermal mass (such as a lead thermal ballast) is added to the magnet, the weight and volume of this added mass can pose problems due to space and structural support limitations. Also, the design of prior art superconducting magnets does not allow replacement of the cryocooler, in single-cryocooler systems, without quenching. What is needed is a superconducting magnet with an extended thermal hold time so the magnet can remain superconductive and operational while the malfunctioning cryocooler is repaired or replaced or while electric power is being restored. Further, the extended thermal hold time feature must not add significant weight, volume, cost, or complexity to the magnet.

SUMMARY OF THE INVENTION

It is an object of the invention to provide a cryocooler-cooled superconducting magnet having an extended thermal hold time.

In its most basic form, the superconducting magnet of the invention includes a superconducting coil assembly, a thermal buffer assembly, and a cryocooler coldhead. The superconducting coil assembly includes a magnet cartridge generally surrounded by a generally spaced-apart vacuum enclosure. The thermal buffer assembly includes pressurized gaseous helium placed within a helium pressure container which is located between the magnet cartridge and the vacuum enclosure, which is in thermal contact with the magnet cartridge, and which is generally spaced-apart from the vacuum enclosure. The cryocooler coldhead includes a cold stage which is positioned in thermal contact with the magnet cartridge and which extends from a housing which is hermetically connected to the vacuum enclosure.

In a more elaborated form, the superconducting magnet of the invention includes the superconducting coil assembly and cryocooler coldhead described in the previous paragraph together with a thermal buffer assembly having the helium pressure container described in the previous paragraph, inlet and outlet tubes, and first and second gas pressure regulators. The inlet and outlet tubes each extend hermetically through the vacuum enclosure, each have a first end hermetically connected to the helium pressure container, and each have a second end located outside the vacuum enclosure. The first gas pressure regulator has an inlet port connected to a source of pressurized gaseous helium and an outlet port hermetically connected to the second end of the inlet tube. The second gas pressure regulator has an inlet port hermetically connected to the second end of the outlet tube and has an outlet port.

In a further elaborated form, the superconducting magnet of the invention modifies the magnet described in the previous paragraph such that the superconducting coil assembly further includes a thermal shield between and spaced apart from the magnet cartridge and the vacuum enclosure, such that the helium pressure container is located between the magnet cartridge and the thermal shield and spaced apart from the thermal shield, such that the inlet and outlet tubes also each extend through the thermal shield, and such that the cold stage is replaced by a first stage extending form the housing and positioned in thermal contact with the thermal shield together with a second stage extending from the first stage and positioned in thermal contact with the magnet cartridge.

Several benefits and advantages are derived from the invention. The high specific heat per unit volume of pressurized helium gas provides a thermal buffer which significantly extends the thermal hold time of the magnet. The gas pressure regulators can be set, as can be appreciated by those skilled in the art, so as to maintain a generally constant helium gas pressure within the pressure container. Helium gas is added by the first gas pressure regulator during charging of the thermal buffer assembly, and helium gas is vented by the second gas pressure regulator during heat load absorption by the helium gas during a cryocooler malfunction. It is noted that such venting also provides a beneficial expansion cooling effect yet further extending the thermal hold time of the superconducting magnet.

BRIEF DESCRIPTION OF THE DRAWINGS

The accompanying drawings illustrate a preferred embodiment of the present invention wherein.

DETAILED DESCRIPTION OF THE INVENTION

Figure 1:
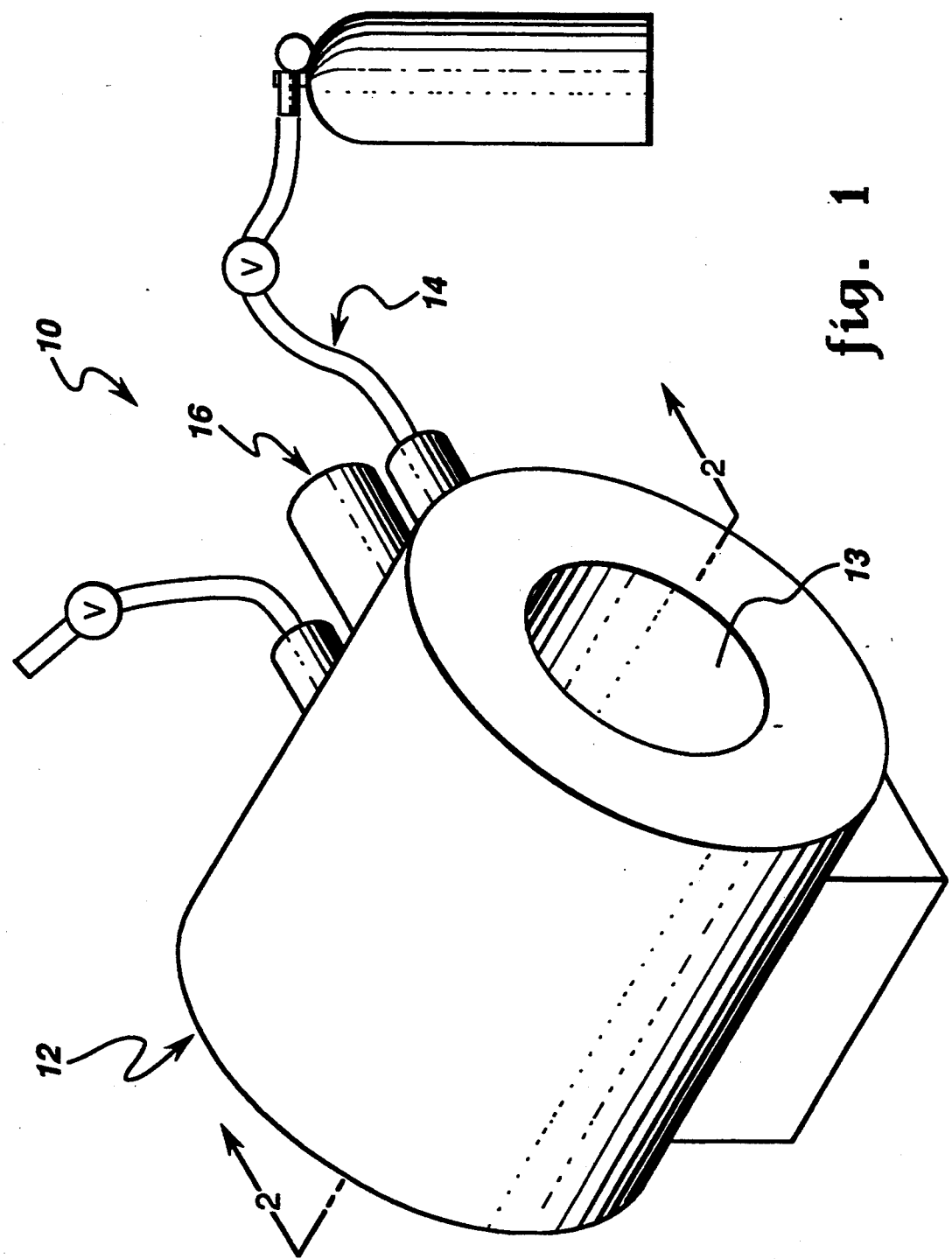
FIG. 1 is a perspective schematic view of the superconducting magnet of the invention.
Figure 2:
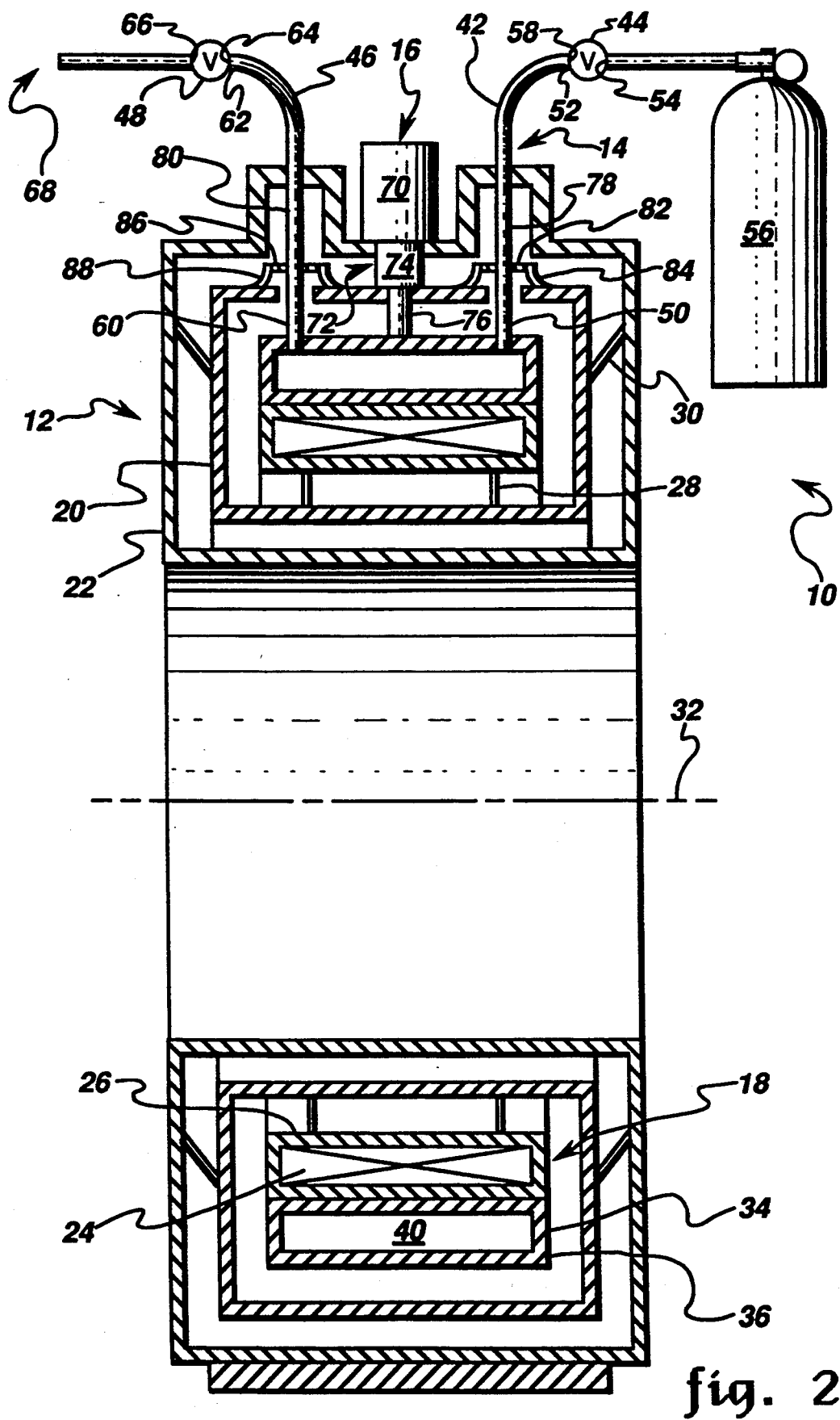
FIG. 2 is a cross-sectional schematic view taken along line 2—2 of FIG. 1 which shows the helium pressure container within the magnet as a generally tubular-shaped pressure vessel.
Figure 3:
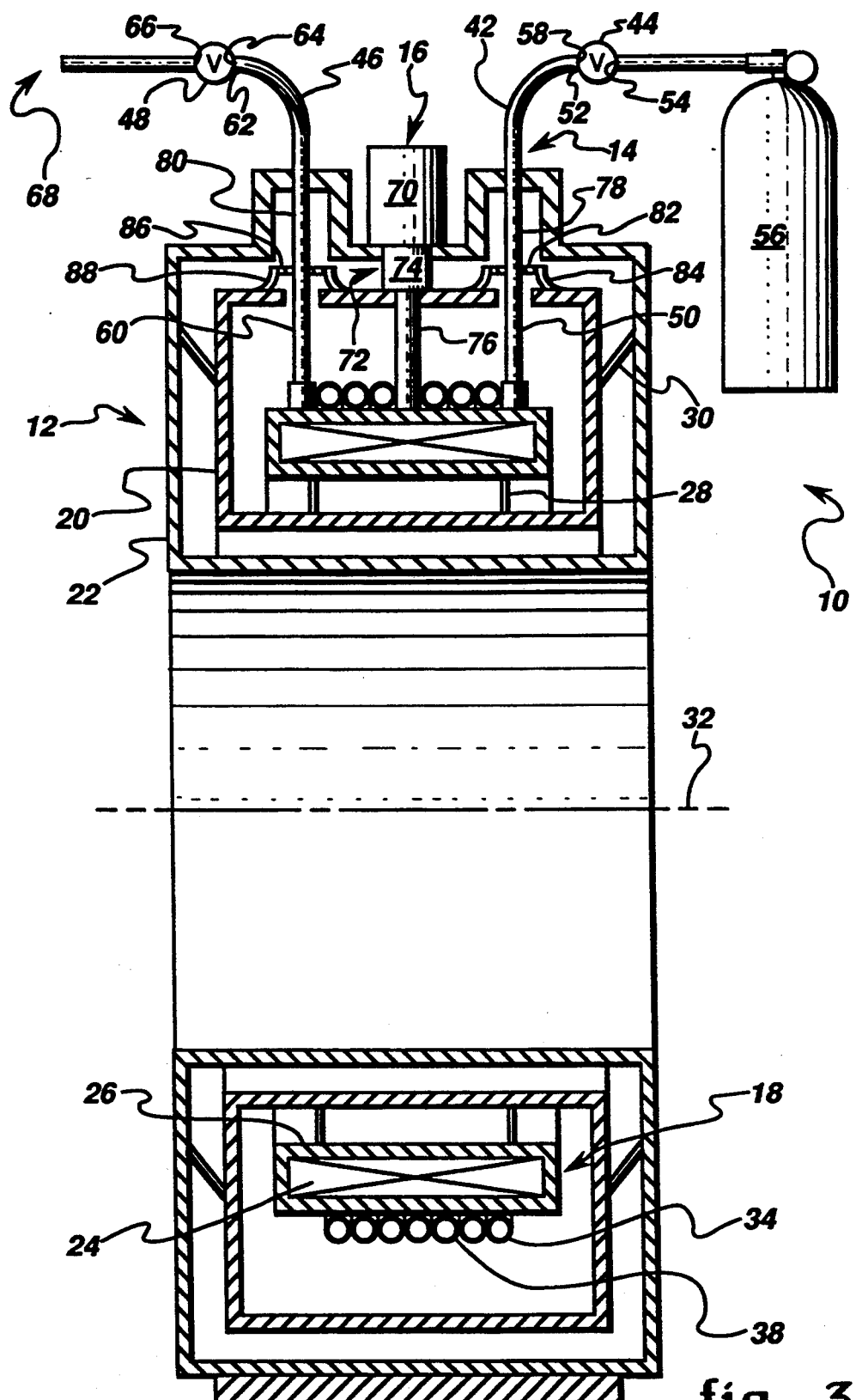
FIG. 3 is the cross-sectional schematic view of FIG. 2, but with the pressure vessel replaced with a generally helical-shaped heat exchanger pipe.

Referring now to the drawings, wherein like numerals represent like elements throughout, FIGS. 1–3 show the superconducting magnet 10 of the present invention. The superconducting magnet 10 includes a superconducting coil assembly 12 (with a bore 13), a thermal buffer assembly 14, and a cryocooler coldhead 16.

The superconducting coil assembly 12 includes a magnet cartridge 18, a thermal shield 20, and a vacuum enclosure 22. The magnet cartridge 18 includes a superconducting wire 24 which is wound on a coil form 26. The thermal shield 20 is generally spaced apart from the magnet cartridge 18, typically by conventional thermal-insulating tubes 28, and generally surrounds the magnet cartridge 18. The vacuum enclosure 22 is generally spaced apart from and generally surrounds the thermal shield 20 and hence is generally spaced apart from and generally surrounds the magnet cartridge 18. Typically, conventional tie rod straps 30 support the thermal shield 20 from the vacuum enclosure 22. The superconducting coil assembly 12 (including its magnet cartridge 18, thermal shield 20, and vacuum enclosure 22) may have any shape. However, preferably the magnet cartridge 18 comprises a generally solenoidal-shaped magnet cartridge 18 having a generally longitudinal axis 32. Preferably, the vacuum enclosure 22 is made of nonmagnetic stainless steel, the tie rod straps 30 are made of racetrack-shaped filamentary glass or carbon graphite reinforced epoxy, the thermal shield 20 is made of aluminum, the thermal insulating tubes 28 are made of filamentary carbon graphite reinforced epoxy, the coil form 26 is made of nonmagnetic stainless steel or fiberglass reinforced epoxy, and the superconducting wire 24 is made of wound and epoxy impregnated niobium-tin.

The thermal buffer assembly 14 includes a helium pressure container 34. The helium pressure container 34 is disposed between the magnet cartridge 18 and the thermal shield 20 and hence is disposed between the magnet cartridge 18 and the vacuum enclosure 22. The helium pressure container 34 is further disposed in thermal contact with the magnet cartridge 18 and generally spaced apart from the thermal shield 20 (and hence generally spaced apart from the vacuum enclosure 22). In a first preferred embodiment (shown in FIG. 2), the helium pressure container 34 comprises a pressure vessel 36. Preferably, the pressure vessel 36 comprises a generally tubular-shaped pressure vessel 36 which is generally coaxially aligned with the magnet cartridge 18 and disposed in generally circumferential thermal contact with the magnet cartridge 18. In a second preferred embodiment (shown in FIG. 3), the helium pressure container 34 comprises a heat exchanger pipe 38 (to better withstand the internal pressure). Preferably, the heat exchanger pipe 38 comprises a generally helical-shaped heat exchanger pipe 38 which is generally coaxially aligned with the magnet cartridge 18 and disposed in generally circumferential thermal contact with the magnet cartridge 18. In an exemplary embodiment, the helium pressure container 34 (such as the pressure vessel 36 or the heat exchanger pipe 38) is made of nonmagnetic stainless steel.

The thermal buffer assembly 14 also includes pressurized gaseous helium 40 disposed within the helium pressure container 34. The invention provides a passive helium gas charge and discharge system such that charging and discharging of the helium pressure container 34 requires a minimum of maintenance and monitoring. To that end, the thermal buffer assembly 14 further includes an inlet tube 42, a conventional first gas pressure regulator 44, an outlet tube 46, and a conventional second gas pressure regulator 48.

The inlet tube 42 extends through the thermal shield 20 and extends hermetically through the vacuum enclosure 22. The inlet tube 42 has a first end 50 hermetically connected to the helium pressure container 34 and a second end 52 disposed outside the vacuum enclosure 22. The first gas pressure regulator 44 has an inlet port 54 in fluid communication with a source 56 of pressurized gaseous helium (such as a conventional helium gas cylinder having a pressure of between generally 500 and 3000 psia) and an outlet port 58 hermetically connected to the second end 52 of the inlet tube 42.

The outlet tube 46 extends through the thermal shield 20, and extends hermetically through the vacuum enclosure 22. The outlet tube 46 has a first end 60 hermetically connected to the helium pressure container 34 and a second end 62 disposed outside the vacuum enclosure 22. The second gas pressure regulator 48 has an inlet port 64 hermetically connected to the second end 62 of the outlet tube 46 and an outlet port 66 preferably in fluid communication with ambient air 68. Preferably, the first and second gas pressure regulators 44 and 48 are set such that the helium pressure container 34 contains helium gas at a pressure of generally 300 psia. For example, the first gas pressure regulator 44 can be set at a back pressure of 290 psia which means it will release higher-pressure helium gas from the source 56 to the helium pressure container 34 via the inlet tube 42 when the pressure in the helium pressure container 34 falls below 290 psia. Similarly, the second gas pressure regulator 48 can be set at a forward pressure of 310 psia which means it will release pressurized gaseous helium 40 from the helium pressure container 34 to ambient air 68 via outlet tube 46 when the pressure in the helium pressure container 34 exceeds 310 psia.

The cryocooler coldhead 16 includes a housing 70 and a cold stage 72. The cold stage 72 comprises a first stage 74 and a second stage 76. Typically the first stage 74 has a temperature of generally 40 Kelvin and the second stage 76 has a temperature of generally 8 Kelvin. In typical magnet use, the housing 70 is generally at room temperature. The housing 70 is hermetically connected to the vacuum enclosure 22. Typically, the hermetic connection includes bolts (not shown in the figures) permitting rapid removal and replacement of the entire cryocooler coldhead 16. The cold stage 72 extends from the housing 70 and is disposed in thermal contact with the magnet cartridge 18. More particularly, the first stage 74 of the cold stage 72 extends from the housing 70 and is disposed in thermal contact with the thermal shield 20, and the second stage 76 of the cold stage 72 extends from the first stage 74 and is disposed in thermal-contact with the magnet cartridge 18.

In the event of loss of operation of the cryocooler coldhead 16, the heat load that is normally extracted by the cryocooler coldhead 16 is absorbed by the pressurized gaseous helium 40 in the helium pressure container 34. The high specific heat per unit volume of the pressurized gaseous helium 40 acts as a thermal buffer for the magnet cartridge 18 to extend its thermal hold time before quenching. This extension of time allows superconductive magnet operation while waiting for electric power to be restored or while waiting for repair or replacement of the cryocooler. It is noted that as the pressurized gaseous helium 40 heats up during a cryocooler failure, its pressure increases. Each time the pressure exceeds the forward pressure setting of the second gas pressure regulator 48, the second gas pressure regulator 48 vents some pressurized gaseous helium 40 to ambient air 68 bringing the pressure down in the helium pressure container 34 to the forward pressure setting level. This venting does work on the venting gas, thereby providing additional cooling to the helium pressure container 34 and hence providing some cooling to the magnet cartridge 18 in a thermodynamic process known as "expansion cooling". The mass of the pressurized gaseous helium 40 in the helium pressure container 34 decreases as the gas venting occurs.

Once electric power is restored or the cryocooler has been repaired or replaced, the cryocooler coldhead 16 will once again extract heat from the magnet cartridge 18 and the helium pressure container 34. As the helium gas in the helium pressure container 34 cools and contracts, the first gas pressure regulator 44 releases helium gas from the source 56 to maintain the pressurized gaseous helium 40 in the helium pressure container 34 at a pressure of generally 300 psia. Equilibrium is reached when the pressurized gaseous helium 40 in the helium pressure container 34 is at a temperature of generally 8 Kelvin and a pressure of generally 300 psia. At this point, the helium pressure container 34 is fully recharged.

A first way to initially charge the helium pressure container 34 with pressurized gaseous helium 40 is to cool down the magnet cartridge 18 using only the cryocooler coldhead 16. Before the cryocooler coldhead 16 is activated, the helium pressure container 34 is charged with helium gas to a pressure of generally 300 psia from the source 56 by setting the back pressure to 290–300 psia on the first gas pressure regulator 44. Once the cooldown is started, the cryocooler coldhead 16 cools the magnet cartridge 18 and the helium pressure container 34, and the pressurized gaseous helium 40 within the helium pressure container 34 cools and contracts. As the pressure of the pressurized gaseous helium 40 in the helium pressure container 34 drops below generally 300 psia due to the gas contraction, the first gas pressure regulator 44 releases more helium gas from the source 56 to maintain the pressure at generally 300 psia. This process continues until the cryocooler coldhead 16 has cooled down the magnet cartridge 18 and the helium pressure container 34 to a desired operating point having a temperature of generally 8 Kelvin and a pressure of generally 300 psia.

A second way to initially charge the helium pressure container 34 with pressurized gaseous helium 40 is to provide a system (not shown in the figures) which introduces a liquid cryogen (such as liquid nitrogen and/or liquid helium) to cool down the magnet cartridge 18 using the helium pressure container 34 as a heat exchanger and using the inlet and outlet tubes 42 and 46 as liquid cryogen conduits. Once the magnet cartridge 18 and the helium pressure container 34 have been cooled to a temperature of generally 4 Kelvin, the helium pressure container 34 is filled with liquid helium. At this point the cryocooler is turned on, the inlet tube 42 is connected to the source 56, the outlet tube 46 is connected to ambient air 68, and the first and second gas pressure regulators 44 and 48 are set to maintain a pressure of generally 300 psia in the helium pressure container 34. As the helium pressure container 34 is pressurized to 300 psia, the liquid helium will be raised above its triple point and will gradually reach an equilibrium at the second stage 76 operating temperature of 8 Kelvin. In reaching this equilibrium, any excess helium gas will be vented to ambient air 68 via the second gas pressure regulator 48, so that the pressure of the pressurized gaseous helium 40 in the helium pressure container 34 will not exceed generally 300 psia. In this manner, the helium pressure container 34 can be completely charged to the desired operating point having a pressure of generally 300 psia and a temperature of generally 8 Kelvin.

Preferably, the inlet tube 42 includes a generally straight portion 78 disposed generally vertically within the vacuum enclosure 22, and the outlet tube 46 includes a generally straight portion 80 disposed generally vertically within the vacuum enclosure 22. It is noted that by so having both the inlet and outlet tubes 42 and 46 oriented vertically, the helium gas within these tubes will stratify, thereby minimizing any heat transfer along the tubes by gaseous recirculation.

In an exemplary embodiment, the inlet tube 42 and the outlet tube 46 are heat stationed to the thermal shield 20 in order to intercept the heat conduction down the tubes from the room temperature vacuum enclosure 22 to the magnet cartridge 18. Preferably, the inlet tube 42 is a nonmagnetic-stainless-steel inlet tube, and the outlet tube 46 is a nonmagnetic-stainless-steel outlet tube. A first copper ring 82 is attached to the inlet tube 42 outside the thermal shield 20, and a first flexible copper strip 84 thermally connects the first copper ring 82 and the thermal shield 20. Likewise, a second copper ring 86 is attached to the outlet tube 46 outside the thermal shield 20, and a second flexible copper strip 88 thermally connects the second copper ring 86 and the thermal shield 20. Such attachments and connections may be made by brazing or soldering.

As can be appreciated from the foregoing description, the thermal buffer assembly 14 utilizes a volume of pressurized gaseous helium 40 within the helium pressure container 34 which is in thermal contact with the magnet cartridge 18 and the second stage 76 of the cryocooler coldhead 16. Hence, the temperature of the pressurized gaseous helium 40 is maintained at generally the same temperature as the magnet cartridge 18. The volume of the helium pressure container 34 is chosen on the basis of available space, as well as to meet the thermal hold time requirements for the superconducting magnet 10.

The foregoing description of several preferred embodiments of the invention has been presented for purposes of illustration. It is not intended to be exhaustive or to limit the invention to the precise form disclosed, and obviously many modifications and variations are possible in light of the above teaching. It is noted that the terminology "thermal contact" includes direct structural contact (such as the thermal contact of the second stage 76 with the magnet cartridge 18 shown in FIG. 3) as well as indirect structural contact (such as the thermal contact of the second stage 76 with the magnet cartridge 18 via the pressure vessel 36 shown in FIG. 2). It is further noted that not all superconducting magnets may have a thermal shield 20. It is intended that the scope of the invention be defined by the claims appended hereto.

We claim:
1. A superconducting magnet comprising:
   a) a superconducting coil assembly including:

(1) a magnet cartridge; and
(2) a vacuum enclosure generally spaced apart from and generally surrounding said magnet cartridge;

b) a thermal buffer assembly including:
(1) a helium pressure container disposed within and generally spaced apart from said vacuum enclosure, wherein said magnet cartridge is disposed outside and in thermal contact with said helium pressure container; and
(2) pressurized gaseous helium disposed within said helium pressure container; and c) a cryocooler coldhead including:
(1) a housing hermetically connected to said vacuum enclosure; and
(2) a cold stage extending from said housing and disposed in thermal contact with said magnet cartridge.

2. The magnet of claim 1, wherein said helium pressure container comprises a pressure vessel, and wherein said magnet cartridge is disposed in thermal solid-conductive contact with said pressure vessel.

3. The magnet of claim 2, wherein said magnet cartridge comprises a generally solenoidal-shaped magnet cartridge having a generally longitudinal axis and wherein said pressure vessel comprises a generally tubular-shaped pressure vessel generally coaxially aligned with said magnet cartridge and disposed in generally circumferential thermal contact with said magnet cartridge.

4. The magnet of claim 1, wherein said helium pressure container comprises a heat exchanger pipe, and wherein said magnet cartridge is disposed in thermal solid-conductive contact with said heat exchanger pipe.

5. The magnet of claim 4, wherein said magnet cartridge comprises a generally solenoidal-shaped magnet cartridge having a generally longitudinal axis and wherein said heat exchanger pipe comprises a generally helical-shaped heat exchanger pipe generally coaxially aligned with said magnet cartridge and disposed in generally circumferential thermal contact with said magnet cartridge.

6. A superconducting magnet comprising:
a) a superconducting coil assembly including:
(1) a magnet cartridge; and
(2) a vacuum enclosure generally spaced apart from and generally surrounding said magnet cartridge;

b) a thermal buffer assembly including:
(1) a helium pressure container disposed between said magnet cartridge and said vacuum enclosure, said helium pressure container further disposed in thermal contact with said magnet cartridge and generally spaced apart from said vacuum enclosure;
(2) an inlet tube extending hermetically through said vacuum enclosure, said inlet tube having a first end hermetically connected to said helium pressure container and a second end disposed outside said vacuum enclosure;
(3) a first gas pressure regulator having an inlet port in fluid communication with a source of pressurized gaseous helium and having an outlet port hermetically connected to said second end of said inlet tube;
(4) an outlet tube extending hermetically through said vacuum enclosure, said outlet tube having a first end hermetically connected to said helium pressure container and a second end disposed outside said vacuum enclosure; and
(5) a second gas pressure regulator having an inlet port hermetically connected to said second end of said outlet tube and having an outlet port; and c) a cryocooler coldhead including:
(1) a housing hermetically connected to said vacuum enclosure; and
(2) a cold stage extending from said housing and disposed in thermal contact with said magnet cartridge.

7. The magnet of claim 6, wherein said inlet tube and said outlet tube each include a generally straight portion disposed generally vertically within said vacuum enclosure.

8. A superconducting magnet comprising:
a) a superconducting coil assembly including:
(1) a magnet cartridge;
(2) a thermal shield generally spaced apart from and generally surrounding said magnet cartridge; and
(3) a vacuum enclosure generally spaced apart from and generally surrounding said thermal shield;

b) a thermal buffer assembly including:
(1) a helium pressure container disposed between said magnet cartridge and said thermal shield, said helium pressure container further disposed in thermal contact with said magnet cartridge and generally spaced apart from said thermal shield;
(2) an inlet tube extending through said thermal shield and extending hermetically through said vacuum enclosure, said inlet tube having a first end hermetically connected to said helium pressure container and a second end disposed outside said vacuum enclosure;
(3) a first gas pressure regulator having an inlet port in fluid communication with a source of pressurized gaseous helium and having an outlet port hermetically connected to said second end of said inlet tube;
(4) an outlet tube extending through said thermal shield and extending hermetically through said vacuum enclosure, said outlet tube having a first end hermetically connected to said helium pressure container and a second end disposed outside said vacuum enclosure; and
(5) a second gas pressure regulator having an inlet port hermetically connected to said second end of said outlet tube and having an outlet port; and c) a cryocooler coldhead including:
(1) a housing hermetically connected to said vacuum enclosure;
(2) a first stage extending from said housing and disposed in thermal contact with said thermal shield; and
(3) a second stage extending from said first stage and disposed in thermal contact with said magnet cartridge.

9. The magnet of claim 8 wherein said inlet tube and said outlet tube each are heat stationed to said thermal shield.

10. The magnet of claim 9, wherein said inlet tube is a nonmagnetic-stainless-steel inlet tube, wherein said outlet tube is a nonmagnetic-stainless-steel outlet tube, and also including a first copper ring attached to said inlet tube outside said thermal shield and a first flexible copper strip thermally connecting said first copper ring and said thermal shield, and further including a second copper ring attached to said outlet tube outside said thermal shield and a second flexible copper strip thermally connecting said second copper ring and said thermal shield.

11. The magnet of claim 8, wherein said second stage of said cryocooler coldhead has a temperature of generally 8 Kelvin and wherein said helium pressure container contains helium gas at a pressure of generally 300 psia.

12. The magnet of claim 11, wherein said source is a source of gaseous helium having a pressure of between generally 500 and 3000 psia and wherein said outlet port of said second gas pressure regulator is in fluid communication with ambient air.

* * * * *